United States Patent
Feiweier et al.

(10) Patent No.: US 11,609,289 B2
(45) Date of Patent: Mar. 21, 2023

(54) METHOD FOR PROVIDING SETTING PARAMETER SETS FOR A MAGNETIC RESONANCE FACILITY, METHOD FOR OPERATING A MAGNETIC RESONANCE FACILITY, PROVISION FACILITY, MAGNETIC RESONANCE FACILITY AND COMPUTER PROGRAM

(71) Applicant: Siemens Healthcare GmbH, Erlangen (DE)

(72) Inventors: Thorsten Feiweier, Poxdorf (DE); Michael Köhler, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 58 days.

(21) Appl. No.: 17/030,744

(22) Filed: Sep. 24, 2020

(65) Prior Publication Data
US 2021/0088610 A1 Mar. 25, 2021

(30) Foreign Application Priority Data
Sep. 25, 2019 (EP) .................................... 19199598

(51) Int. Cl.
*G01R 33/48* (2006.01)
*G01R 33/54* (2006.01)
(Continued)

(52) U.S. Cl.
CPC ....... *G01R 33/3804* (2013.01); *G01R 33/543* (2013.01); *G01R 33/3852* (2013.01); *G01R 33/3856* (2013.01)

(58) Field of Classification Search
CPC .............. G01R 33/3804; G01R 33/543; G01R 33/3852; G01R 33/3856; G01R 33/3614; G01R 33/546
See application file for complete search history.

(56) References Cited

U.S. PATENT DOCUMENTS

2013/0181708 A1* 7/2013 Biber ............... G01R 33/34023
324/307
2015/0123661 A1 5/2015 Yui et al.
(Continued)

FOREIGN PATENT DOCUMENTS

| EP | 3454071 A1 | 3/2019 |
| EP | 3683594 A1 | 7/2020 |
| JP | H0856917 A | 3/1996 |

OTHER PUBLICATIONS

Chu, Kenneth C. et al. "MR Gradient Coil Heat Dissipation" Magnetic Resonance in Medicine, vol. 34, No. 1, pp. 125-132, Jul. 1995 //https://doi.org/10.1002/mrm.1910340119.
European Search Report dated Apr. 9, 2020, for Application No. 19199598.4.

*Primary Examiner* — Rishi R Patel
(74) *Attorney, Agent, or Firm* — Banner & Witcoff Ltd.

(57) ABSTRACT

In a method for providing setting parameter sets for at least one measuring protocol described by protocol parameters for acquiring magnetic resonance data with a magnetic resonance facility, setting parameter set is determined for each of at least two temperature status categories of the magnetic resonance facility using a temperature model describing a development of a temperature status of at least one component of the magnetic resonance facility. The method also includes preventing overheating of the at least one component due to the measurement with the measuring protocol being repeated a maximum number of times for a specified number of repetitions.

16 Claims, 3 Drawing Sheets

(51) Int. Cl.
*G01R 33/38* (2006.01)
*G01R 33/385* (2006.01)

(56) References Cited

U.S. PATENT DOCUMENTS

| | | |
|---|---|---|
| 2017/0045590 A1 | 2/2017 | Takai et al. |
| 2019/0072624 A1 | 3/2019 | Biber |
| 2020/0225306 A1 | 7/2020 | Feiweier et al. |

* cited by examiner

METHOD FOR PROVIDING SETTING PARAMETER SETS FOR A MAGNETIC RESONANCE FACILITY, METHOD FOR OPERATING A MAGNETIC RESONANCE FACILITY, PROVISION FACILITY, MAGNETIC RESONANCE FACILITY AND COMPUTER PROGRAM

CROSS REFERENCE TO RELATED APPLICATIONS

This patent application claims priority to European Patent Application No. 19199598.4, filed Sep. 25, 2019, which is incorporated herein by reference in its entirety.

BACKGROUND

Field

The disclosure relates to a method for providing setting parameter sets for at least one measuring protocol described by protocol parameters for acquiring magnetic resonance data with a magnetic resonance facility. The setting parameter set can include specified values for at least some of the protocol parameters and/or specified value ranges for at least some of the protocol parameters. Additionally, the disclosure relates to a method for operating a magnetic resonance facility, to a provision facility, to a magnetic resonance facility and to a computer program.

Related Art

Magnetic resonance imaging (MRI) is now established in clinical operation as a medical imaging modality. A large number of possible imaging techniques exist in which, in the framework of measuring protocols, one or more different magnetic resonance sequence(s) can be used in a course over time specified by the measuring protocol to acquire magnetic resonance data of an examination object, in particular of a patient. This means protocol parameters, which describe a measuring protocol, comprise, in particular, also sequence parameters of the magnetic resonance sequences used therein.

The measuring protocols and magnetic resonance sequences use different components of the magnetic resonance facility to implement imaging. Conventionally, at least one radio frequency pulse is irradiated to excite the examination region for which purpose a radio frequency coil arrangement can be used, which can also be used to receive the resulting magnetic resonance signals if a specific receiving coil arrangement, for example as a local coil arrangement, is not provided for this purpose. The power for radio frequency pulses to be emitted is conventionally generated by means of a radio frequency power amplifier (RFPA). For spatial encoding gradients are used in magnetic resonance imaging, with the corresponding gradient fields being generated by means of a corresponding gradient coil arrangement, which, in turn, is fed by a gradient power amplifier (GPA). Further components of the magnetic resonance facility comprise, for example, in addition to the obviously present basic field magnet in the main magnetic unit, shim coil arrangements, various cooling facilities and the like.

Such components are hardware, which, owing to its design, can have power limits in respect of its temperature status. For example, in gradient-heavy magnetic resonance sequences, a large number of gradient pulses is necessary, which can result in heating, in particular in the gradient power amplifier itself, but also in other components of the magnetic resonance facility. If a limit temperature is reached for components heated in this way, for example the gradient coil or the gradient power amplifier, the corresponding component must be switched off and, therefore, usually, the measurement terminated. The temperature should not be allowed to exceed a limit temperature that describes an operating limit, therefore. Therefore, magnetic resonance sequences or, more generally, measuring protocols should be configured such that, as far as possible, the components of the magnetic resonance facility do not overheat. Magnetic resonance sequences, which demand a high gradient power, are, for example, what are known as EPI sequences (Echo Planar Imaging), which can be played out, frequently repeated, for example in the course of diffusion imaging.

It has already been proposed in the prior art to limit settable protocol parameters on the magnetic resonance facility to such an extent that the examination, in particular a particular measuring protocol, can be carried out without hardware components having to be cut off or switched off for protection and without the image quality being impaired owing to the powers demanded by the magnetic resonance sequence not being attained. Owing to the complex dependences within the individual protocol parameters, determining values of the protocol parameters that are still just possible and completely utilize the capability of the magnetic resonance facility is often only possible by rolling out the complete measuring protocol or the magnetic resonance sequences included therein, in the case of a plurality of protocols of an examination, optionally also only by rolling out the entire course of the examination.

In this context it has already been proposed in the prior art to model the effect of protocols on the system status in respect of the temperature, for example by way of a temperature model. The idea here is to roll out magnetic resonance sequences within a temperature model of this kind in order to simulate their effect on the temperature. It is possible, therefore, to estimate how long the magnetic resonance facility can be operated at a particular power before the operating limit is reached. Cooling facilities of the magnetic resonance facility can in one example dissipate only a finite quantity of heat. If due to the stress of the gradient power amplifier or of the radio frequency power amplifier or other components more heat is supplied than the cooling facility can dissipate, the magnetic resonance facility, specifically the component, heats up and must be switched off on reaching a limit temperature. A large number of aspects contributing to the performance of the magnetic resonance facility can be summarized by way of simple observation of the temperature status of the magnetic resonance facility, therefore.

In order not to exceed the limits in respect of the temperature, to prevent overheating, therefore, the protocol parameters of a measuring protocol are conventionally selected on the basis of empirically determined variables. In this connection and also when using a temperature model it is known to limit as variables primarily the maximum amplitude of all gradient pulses or parts of the gradient pulses of a magnetic resonance sequence and/or the averaged gradient strength.

Primarily, the averaging of the gradient strength squared is considered for the calculation of an averaged gradient strength since, for a given gradient strength, a certain current has to be generated whose square is proportional to a thermal power, which is to be kept low. Specifically, the gradient strength mean squared Gms ("ms" for "mean squared") can then be used as the averaged gradient strengths:

$$Gms = \frac{1}{t_d} \int_0^{t_d} G(t)^2 dt, \quad (1)$$

where $t_d$ is the length of the averaging period and G(t) the time-dependent gradient strength, or else the root mean squared Grms ("rms" for "root mean squared") calculated therefrom.

$$Grms = \sqrt{\frac{1}{t_d} \int_0^{t_d} G(t)^2 dt}. \quad (2)$$

To ensure the operation of the magnetic resonance facility without exceeding the thermal limitations, the variables just mentioned by way of example are limited, therefore. The result of this is that the individual gradient pulses are limited in their amplitude and/or that the measuring protocol or the at least one included magnetic resonance sequence has to be provided with breaks in order to prevent overheating. Both of these factors can adversely lengthen the measurement time and/or result in reduced image quality, in particular in the case of severe limitation.

Previously used methods aim at each magnetic resonance measurement adhering to the thermal limit and adhering to it even when the measurement is repeated several times. This long-term view can be designated the principle of random repeatability of measuring protocols, and this is also known by the term "run once, run ever"—RORE. This means that, in respect of the protocol parameters, magnetic resonance sequences are basically configured such that, firstly, each measurement can be performed as often as desired and, secondly, does not depend on the initial system status of the magnetic resonance facility. Even with a magnetic resonance facility that has heated up, any RORE measuring protocol can be run since it does not result in further net heating, which could lead to the limit temperature being reached and therewith overheating. This simplifies operation of the magnetic resonance facility enormously but for many measuring protocols results in unnecessarily severe limitations being used, described, for example, by a setting parameter set.

In a different approach protocols are determined such that they can only be performed once ("run once", RO). Protocol parameter sets determined in this way use the capacity of the magnetic resonance facility to the extent that the status parameters are allowed to change up to the operating limit, therefore. This is accompanied by the need to incorporate the initial system status of the magnetic resonance facility in the modeling.

If the magnetic resonance facility has, for example, already heated up, it is no longer possible to carry out measurements, which would heat the magnetic resonance facility or the specifically affected components beyond the operating limit. Since the magnetic resonance facility cools down again in the rest state, for a given RO protocol it is possible to determine from when it can be run again. The use of RO protocols can be supported by the introduction of measuring breaks, therefore, although this can sometimes significantly impair the measuring process. Therefore, approaches of this kind have not been pursued up until now.

Until now, the values of the protocol parameters, which authorize the magnetic resonance facility for a measurement, have been so conservatively limited that the capacity of the magnetic resonance facility cannot generally be fully utilized. In particular, it can be provided that only protocols according to the RORE approach are used. This results in a suboptimum utilization of the available system performance, and this is questionable in particular against the background of increasing cost pressure for the hardware components used. Furthermore, magnetic resonance facilities have already been proposed, which are capable in relation to relatively high peak powers, but, associated therewith, can provide a lower nominal continuous power, and this can further reduce the achievable magnetic resonance data quality with RORE protocols or further lengthen the acquisition time, although the magnetic resonance facility would basically be capable of much improved performances.

The subsequently published European patent application EP 19152127.7 discloses a method for operating a magnetic resonance facility, wherein a boost parameter that can be specified by the user is used to provide a greater capacity for a particular measurement compared to the concept of the randomly frequent, in other words, unlimited, repeatability of a protocol or protocol segment. This application proposes deviating from the strict RORE requirement for protocols to be run and to permit a user requirement for a certain heating of the magnetic resonance facility. As a function of the boost parameter, adjustment parameters are determined, which allow improved utilization of the capacity of the magnetic resonance facility. These can be determined by simulation of the behavior of the at least one status parameter, in particular by rolling out the protocol segment and/or using a status parameter model.

Operation of the magnetic resonance facility is again complicated hereby, however, in particular, since, first of all, the user has to learn possible setting values for the status parameter.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclose is to provide setting parameter sets, which include specifications for protocol parameters of measuring protocols for a magnetic resonance facility, which, firstly, allow improved utilization of the capacity of the magnetic resonance facility, but, secondly, provide less complicated operation of the magnetic resonance facility.

In a method of the type mentioned in the introduction, it is inventively provided that one setting parameter set each is determined for at least two temperature status categories of the magnetic resonance facility using a temperature model that describes the development of the temperature status of at least one component of the magnetic resonance facility, which is heated when the measuring protocol is run, during running of the measuring protocol in such a way that for each starting temperature status, which is included in the temperature status category, at the beginning of a measurement using a measuring protocol, uses the protocol parameter according to the specifications of the setting parameter set, overheating, described by exceeding a limit temperature, of the at least one component, due to the measurement with the measuring protocol repeated a maximum number of times for a specified number of repetitions, is prevented.

A measuring protocol is used for acquiring magnetic resonance data with a magnetic resonance facility, here in particular a magnetic resonance facility of a particular type or model. A measuring protocol conventionally comprises at least one magnetic resonance sequence, so the protocol parameters, which describe the measuring protocol, also comprise the sequence parameters of the at least one magnetic resonance sequence. According to the specific embodiment, protocol parameters of a measuring protocol can be permanently specified on the magnetic resonance facility, but, in addition or as an alternative, it is also conceivable for a user to adjust the protocol parameters to his needs, in particular within a particular setting range. Therefore, for example in the prior art, measuring protocols are known in which the repetition times (TR), echo times (TE) and the like can basically be adjusted for which purpose a particular setting range can be specified. If a user selects a particular measuring protocol on the magnetic resonance facility, the values of the protocol parameters to be used or start values in the case of an adjustability are provided exactly like optionally required setting ranges on the magnetic resonance facility, conventionally by setting parameter sets or specifically their setting parameters, which predefine a specification for the protocol parameters or their value ranges, therefore. The present disclosure is directed to providing such setting parameter sets for a magnetic resonance facility, especially a particular one, wherein these setting parameter sets are conventionally already predetermined ex-works, in other words before first operation of the magnetic resonance facility, and are as it were "included" with the magnetic resonance facility.

In one or more exemplary embodiments of the present disclosure, it can be expedient and also be provided in exemplary embodiments that setting parameter sets are determined for a plurality of different measuring protocols. For example, in a specific case a user, following delivery of the magnetic resonance facility, can be provided with a choice between different measuring protocols for different clinical issues, after the selection of which values can be predefined for the protocol parameters and optionally adjusted within particular setting ranges.

The present disclosure refers, in particular, to those protocol parameters whose use has an effect on the temperature status of the magnetic resonance facility, in particular the temperature of at least one component of the magnetic resonance facility, therefore. A component of this kind can be, for example, a gradient amplifier, a gradient coil arrangement thereof, a high power amplifier and/or cable. For example, the use of gradient pulses, in particular gradient pulses of higher amplitude, can result in heating of a component of this kind, which in turn, however, should not exceed an operating limit described by a limit temperature, should not be overheated, therefore. To estimate this, a temperature model is used by way of which it is possible, for example, to predict which heating is to be expected with particular protocol parameters, which can also affect course of time of the measuring protocol or at least a magnetic resonance sequence used and the like. Protocol parameters, which affect the temperature status of the magnetic resonance facility, can describe, for example, gradient pulses or else, generally, the time interval after which, for example in the case of longer repetition times, longer cooling periods exist. Break periods can also be described by protocol parameters. The temperature model is accordingly used to estimate which protocol parameters are conceivable to prevent overheating of the at least one component, wherein obviously a plurality of components can also be considered here, or else the most critical component, if this would at least substantially always overheat first. The corresponding values or margins for protocol parameters, specified values and predefined value ranges, therefore, form a setting parameter set.

In one or more exemplary embodiments of the present disclosure, it has been recognized that the starting temperature status of the magnetic resonance facility plays a fundamental role in the issue of overheating. If, for example, a component is already very hot at the beginning of a measuring protocol, its temperature is, for example, close to the limit temperature, therefore, then there is a considerably higher risk of overheating and a much lower margin for protocol parameters or combinations of their values, which can be used without danger, therefore. The present disclosure accordingly proposes categorizing temperature statuses possibly present at the beginning of the measuring protocol into temperature status categories to provide setting parameter sets for a plurality of such temperature status categories.

This providing of a plurality of setting parameter sets for a measuring protocol, which are in each case suitable for a different temperature status category, entails clear advantages in respect of the user-friendliness of the magnetic resonance facility since an automatic selection, which is intended to prevent overheating, is still possible but improved utilization of the capacity of the magnetic resonance facility can nevertheless be enabled using the temperature status categories. For example, as will be discussed in more detail below, a setting parameter set can be selected according to conventional use of the magnetic resonance facility, in particular its usage category, and/or on the basis of a starting temperature status actually present of the magnetic resonance facility.

The setting parameters of the setting parameter sets are determined such that for each starting temperature status, which is included in the corresponding temperature status category, when using a measuring protocol according to specification by the setting parameter set, overheating of the at least one component is prevented. In other words, it is no longer assumed that the setting parameter set has to be determined such that for all conceivable starting temperature statuses of the magnetic resonance facility overheating is prevented, and instead a distinction is made according to temperature status categories, the "worst case" is no longer conservatively assumed, therefore. In other words, a predefined temperature status of the magnetic resonance facility is assumed and the protocol parameters optimized for these circumstances, so corresponding specifications in the form of the setting parameters result. The choice of these predefined temperature status categories can represent an estimate determined in different ways, which indicates how hot the magnetic resonance facility typically is and/or is most probable in the "worst case" case at the beginning of the relevant measurement with the measuring protocol. Accordingly, this procedure, in contrast to the specification of a boost parameter, represents a fully automatic optimization of the measuring procedure and has the advantage that the user can be provided with a valid estimate with which protocol parameters a measurement will most probably be carried out.

For example, the settable value range, for example for TE and TR, can also vary depending on assumed or actual initial conditions, in other words, starting temperature statuses, on the magnetic resonance facility for which the setting parameter sets are to be provided. With "ideal" start conditions, by means of the setting parameter set associated with the corresponding temperature status category, a larger value range for setting can be provided, for example shorter repetition times can be set, than with "typical" starting temperature statuses. With "worst case" starting temperature statuses, for example the smallest possible value range can be provided for setting, so, for example, a threefold division is possible. As far as setting parameters, which directly reflect values for protocol parameters are concerned, an analogous observation can of course be made, so, for example, the shortest repetition times exist with ideal thermal initial conditions, a corresponding temperature status category therefore, through to longer repetition times with temperature status categories that reflect worse initial conditions.

In other words, for the predefinition of expedient parameterizations, described by the setting parameter sets, of measuring protocols it is proposed that typical starting temperature statuses, which are to be expected in typical or realistic use, are assumed. This procedure is particularly advantageous to provide the user, even before running or before the start of a measuring protocol, with at least one magnetic resonance sequence with a valid estimate with which protocol parameters the relevant measuring protocol can most probably run. In this way, for example optimized sequences of magnetic resonance measurements, in each case described by a measuring protocol, may be predefined in which optimized measurements with a high gradient load and those with a low gradient load alternate.

It should also be noted at this point that the use of a temperature model, in contrast to sample measurements, on a particular magnetic resonance facility has several advantages. Firstly, the modeling covers particular tolerances which would be missing in specifically usable measuring phantoms. Secondly, there can also be certain differences between magnetic resonance facilities of one type or model, which can have effects on setting parameter sets. A temperature model may be advantageously calibrated to a particular magnetic resonance facility however, so the individual instance variation is reduced. This will be discussed in more detail below.

One or more specific number(s) or repetitions can be assumed within the scope of the present disclosure. While the number of repetitions can basically also be zero (RO case), within the scope of the present disclosure it has proven to be particularly advantageous to select the number of repetitions as one. Within the scope of the present disclosure, generally speaking, a fixed number of repetitions, how often a measuring protocol should be repeated, can be used, wherein it is particular preferably defined that exactly one repetition must be possible. Based on typical, known workflows this selection is an expedient one, which covers most cases. If setting parameter sets are determined for a plurality of measuring protocols it is of course conceivable to also predefine the number of repetitions so as to be specific to the measuring protocol. While, theoretically, specification of an infinitely frequent repeatability (RORE case) is also conceivable, this is less preferred within the scope of the present disclosure, however, since this case does not necessarily correspond to the situation in practice and represents too conservative an assumption.

In one or more exemplary embodiments of the present disclosure, however, to determine setting parameter sets for different numbers of repetitions. For example, as a type of fallback option it is possible to determine a RORE setting parameter set for a temperature status category that includes the highest temperature statuses and likewise provide it to the magnetic resonance facilities if other protocol parameter specifications are no longer expediently possible.

In one or more exemplary embodiments of the present disclosure it can also be provided, in the case of a plurality of included setting ranges, that the setting parameter set is determined inclusive of dependencies between at least some of these setting ranges. In magnetic resonance it is often the case that the temperature of the protocol parameters influencing at least one component can have value ranges or settings that are dependent on each other. If, for example, a lower maximum gradient strength for gradient pulses is selected, shorter repetition times are conceivable than with higher maximum gradient strengths. Accordingly, the value ranges can be predefined in the setting parameter set such that, according to the setting of a protocol parameter, the selectable value range for a different protocol parameter can change. Dependencies of this kind can also be stored in the setting parameter set as mathematical correlations.

In a particularly advantageous aspect of the present disclosure, the temperature status categories can be defined by evaluating starting temperature statuses determined when using an at least substantially structurally identical magnetic resonance facility for specification information that describes the measuring protocol. In this case it is, for example, conceivable in the case of magnetic resonance facilities of the same type or model already in operation, in other words, structurally identical magnetic resonance facilities, to define measured starting temperature statuses, or those determined in some other way, at the beginning of the measuring protocol for which setting parameter sets are to be determined. It can be provided, for example, that with conventional data acquisition and operations monitoring of magnetic resonance facilities, such specification information is acquired and logged anyway. It is already known in the prior art for the manufacturer of the magnetic resonance facilities, for example, to collate operating information of this kind and evaluate it accordingly as to in which framework the specification information can also be compiled and/or the temperature status categories can be defined.

It can particularly advantageously be provided that the specification information is present broken down according to at least one usage category, wherein the evaluation and/or the definition of the temperature status categories takes place as a function of the usage categories. Within the scope of the present disclosure a usage category should be taken to mean that the field of application of the magnetic resonance facility, in other words, its operating conditions after start-up, are depicted. For example, if, in addition to magnetic resonance facilities, which are constantly utilized at full capacity in clinical use and can also use many demanding measuring protocols, also in respect of the temperature, magnetic resonance facilities are also known in fields of use in which a much lower utilization exists, for example longer breaks exist between individual examination procedures, and/or fewer laborious or complex measuring protocols are used. Finally, magnetic resonance facilities are also known, which are operated in high-load mode, for example for research purposes or the like. Therefore, it is conceivable by way of example to define a usage category for "sporadic use", a usage category for "typical use" and a usage category for "heavy use" and to sort the specification information accordingly, since, for example with magnetic resonance facilities using heavily loaded and demanding measuring protocols for research purposes, higher temperatures exist more frequently than for example with typically or only sporadically used magnetic resonance facilities. Accordingly, it is also possible, for example, to define for each usage category a corresponding temperature status category, for example in such a way that the majority of the starting temperature statuses detected in the specification information are incorporated and, in addition, an exceptional case category can still be defined. In particular it is possible, therefore, to provide directly suitable setting parameter sets for particular magnetic resonance facilities for which the future usage category is known.

Expediently, at least some of the temperature status categories can be determined in such a way that a predefined proportion of the starting temperature statuses of the specification information considered, in particular specific to the usage category, and which rules out starting temperature statuses with the highest temperatures, is included. For example, a standard setting parameter set to be used, in particular with one usage category, can be determined for a starting temperature category, which covers 80 to 95%, for example 90%, of the starting temperature statuses to be expected according to specification information.

In addition and/or as an alternative, an embodiment of the present disclosure provides that at least some of the temperature status categories are defined by threshold values for the temperature of the at least one component, wherein, in particular, the threshold values are selected at least partially as a function of a cooling temperature to which the component is cooled by means of a cooling facility associated therewith, and/or the limit temperature. Therefore, it can be provided, for example, that a temperature status category is defined for ideal initial conditions in such a way that the component is at the cooling temperature or at least only in an interval thereabove, while typical initial conditions in a starting temperature category are, for example, the temperature range excepting ideal initial conditions through to the cooling temperature plus half the difference between the limit temperature and the cooling temperature. Finally, "worst case" initial conditions can be covered by the remaining cases in which the component is at or close to the limit temperature. Of course, other possibilities are also possible for the definition of suitable temperature status categories by means of the cooling temperature and/or the limit temperature.

Generally it is also conceivable for at least some of the temperature status categories to be defined as a function of a mode of the magnetic resonance facility in a period ending right at the beginning of the measuring protocol. For example, a break in use before the beginning of the measuring protocol defines to what extent the magnetic resonance facility is cooled from the previous use and the like. Therefore, it is possible, for example, to define a temperature status category for ideal initial conditions in such a way that the magnetic resonance facility had at least five minutes to cool down, for example due to a change of patient and/or a localizer measurement. "Worst case" initial conditions can be defined for example in such a way that the magnetic resonance facility was previously operated over at least one particular period with non-RORE measuring protocols, which provide for heating.

Some examples as to how temperature status categories can be defined for "ideal initial conditions", "typical initial conditions" and "worst case initial conditions" shall be summarized hereinafter, wherein these are to be understood as being purely exemplary and do not limit the subject matter of the present disclosure.

Therefore, for example "ideal initial conditions" can be assumed if
- the at least one component is at the cooling temperature or
- the magnetic resonance facility had at least five minutes to cool down or
- the magnetic resonance facility is in a temperature status range in which, statistically, for example 10% of the clinical measurements, in particular based on the usage category, start.

A temperature status category for "typical initial conditions" can be defined, for example, in that
- the at least one component is at most at the total of the cooling temperature and half of the interval between limit temperature and cooling temperature or
- the magnetic resonance facility was previously operated for at least 30 minutes with RORE measuring protocols if these are configured to maintain an interval from the limit temperature, or
- the magnetic resonance facility is within a temperature status range in which, statistically, 80% of the clinical measurements start, with the highest temperature statuses being ruled out.

A temperature category with "worst case" initial conditions can be defined in that, for example:
- the at least one component is at or close to the limit temperature or
- the magnetic resonance facility was previously operated over several minutes with measuring protocols with which a mean gradient strength exceeding a predetermined limit is used.

In an exemplary embodiment of the present disclosure, a linear temperature model can be used in which, in a differential equation, a linear correlation between the temperature and its derivation over a time constant is assumed and an energy balance that takes into account the power input is formed. An exponential correlation can be assumed as the solution to the differential equation.

By way of such a temperature model it is in particular possible, therefore to model the heating behavior of the at least one component to be able to optimally utilize the existing limitations. Different predictions can be created from a temperature model of this kind, for example the possible power which can be applied under certain boundary conditions, for example as a function of the starting temperature of the component and/or the cooling temperature of the component, over a defined period before the thermal limit of the at least one component, the limit temperature, therefore, is reached. It should be emphasized in this connection that the applicable possible power can also depend on the predicted measurement time, for example sequence time.

Furthermore, by way of such a temperature model a prediction of the duration can be made during application of a particular power until the at least one component reaches a certain temperature increase, for example the limit temperature of the at least one component. This allows, for example, the prediction as to how often a certain magnetic resonance sequence or a particular measuring protocol can be repeated before a thermal limit is reached.

Finally, the temperature, which a component is not allowed to exceed at a particular instant, for example at the start of the measuring protocol, can also be predicted so, for a certain time, a certain power can be applied, which results in a defined temperature of the at least one component. This allows, for example, the prediction as to how long the wait must be until the at least one component has cooled to the extent that a particular measuring protocol with defined protocol parameters can be run without, for example, cooling breaks having to be included in the measuring protocol. For particular examinations this can be expedient if, for example, the inclusion of cooling breaks can result in losses in image quality.

As already indicated, for providing setting parameter sets, a linear temperature model is particularly preferably used, which can be described by the differential equation $$\dot{T} = P - \frac{1}{\tau}(T - Tcool). \tag{3}$$

Herein T designates the temperature, $\dot{T}$ the change thereof over time (the first derivation according to time, therefore) and P the applied thermal power, $\tau$ the thermal time constant and Tcool the cooling temperature with which the relevant component is cooled by way of a suitable mechanism, specifically a cooling facility. For example, the cooling temperature can be a temperature of a coolant used. A solution to this differential equation can be formulated as $$T = (\tau P + Tcool - T0)\left(1 - e^{-\frac{t}{\tau}}\right) + T0, \tag{4}$$

where T0 designates the starting temperature. The result of this is that, for example for the temperature of a component whose starting temperature matches the cooling temperature and which experiences a constant thermal load, the temperature initially increases exponentially and finally ends in a saturation temperature. To protect the at least one component that is relevant here, it is assumed that its temperature is not allowed to exceed a limit temperature. Therefore, in the context of magnetic resonance sequences, care should be taken that, as specific protocol parameters, the sequence parameters are limited correspondingly. This can mean, for example, that the played out gradient pulses have to be restricted in a certain way and/or that during which the course of at least one magnetic resonance sequence of a measuring protocol breaks have to be included during which the at least one component can be cooled.

In an exemplary embodiment, the time constant is longer than one minute, wherein, in particular, the power input is assumed to be proportional to a mean gradient power, in particular a mean gradient strength squared.

In the context of the present disclosure, components are of interest, which, in respect of their heating, have a thermal time constant $\tau$, which is much greater than the time structure with which the respective component is thermally loaded. This then produces the possibility of simplifying calculation of the temperature effects due to thermal loads to the extent that the respective thermal load is averaged over a certain period. As stated in the introduction, such components can be, for example, a gradient coil arrangement, a gradient amplifier, a cable or the like.

With typical magnetic resonance sequences, in which gradient pulses are applied, these conventionally have durations in the region of approx. 100 µs to 100 ms. The duration between wholly or partially repeating gradient patterns is conventionally in the range of a few milliseconds to a few seconds. The gradient pulses represent a thermal load since, for their generation, currents flow in the components mentioned by way of example above, which currents, due to ohmic losses, generate the thermal power. Therefore, what are considered here are components whose thermal time constant is much longer than this time structure of the magnetic resonance sequences, in other words, in particular more than one minute, optionally several minutes.

This makes it possible, in particular, to regard the thermal power P as proportional to the gradient strength mean squared, cf. in this regard equation (1) presented in the introduction. Here, the determination time should be set to be long with respect to the time structure of the magnetic resonance sequence, for example in the region of the thermal time constant $\tau$. It can be written as follows:

$$P = \alpha Gms. \tag{5}$$

Here, $\alpha$ is a proportionality constant, which represents a model parameter.

At least one model parameter of the temperature model, in particular the time constant, can be determined in a calibration measurement with the magnetic resonance facility, wherein, in particular, a magnetic resonance sequence incorporating a known mean gradient power is used. This means that calibration measurements can be carried out to determine the values for example of the model parameters $\alpha$, $\tau$ and Tcool, wherein the cooling temperature Tcool can also be regarded as known since it designates the temperature of cooling, for example of the coolant, and it can be directly determined or is known, therefore. The calibration measurement can take place, for example, with a standardized magnetic resonance sequence, which applies a known gradient strength mean squared Gms. The model parameters can be determined from the measurement of the temperature of the at least one component and by way of a fit of equation (4) to the calibration data determined in the calibration measurement. Preferably, each example of a type or model of magnetic resonance facility is calibrated, for example ex-works, to take account of the production spread and to obtain the optimum performance for each magnetic resonance facility. It is also conceivable, however, to determine the model parameters by calibration to a suitable sample of structurally identical magnetic resonance facilities, with extreme values or averaged values of this sample being used to enable by way of an optionally conservative estimate at least one identical performance for all magnetic resonance facilities of this type or model.

In an exemplary embodiment, the linear temperature model is used for predictions, with different specific methods being conceivable methods for determining setting parameters as the specification for protocol parameters, which can also be used at least partially combined. Different issues are conceivable in the calculations, for example how much power can be incorporated so overheating does not occur with a particular starting temperature or, in general, with a particular starting temperature status, how long a particular power can be used until the limit temperature is reached and the like.

Using the example of formulae (4) and (5), this can be achieved, for example, by rearranging $$Gms = \frac{1}{\alpha\tau}\left(\frac{T-T0}{1-e^{-\frac{t}{\tau}}} + T0 - Tcool\right). \quad (6)$$

Using formula (6) it is possible to directly predict which gradient strength mean squared is possible for a particular period t with a starting temperature T0 to reach or not exceed a temperature T. The period t can be, for example, the predicted run time of a measuring protocol or the at least one magnetic resonance sequence, which uses the measuring protocol. Equations (1) and (2) can be taken into account for determining necessary cooling breaks or for reducing gradient amplitudes. As already mentioned, however, the model used here, in particular equations (4) and (5), can also be used for further predictions, however. These likewise follow from a direct rearranging of the relevant equations.

The predictions of the temperature model can accordingly be used to automatically determine specifications for the protocol parameters of a measuring protocol with at least one magnetic resonance sequence in the form of the setting parameters and provide them in such a way that the measuring protocol is able to run under all conditions of the corresponding temperature status category without exceeding the thermal limits of the at least one component, wherein, at the same time, an optimization can take place in respect of the measuring time and/or the image quality.

This can optionally require the iterative application of a predicting procedure with the temperature model, so it can be provided that the setting parameters are determined, in particular in respect of the setting ranges, in an iterative method. For example, calculation of the maximum applicable gradient strength mean squared Gms can start from an approximate run time of the measuring protocol or its at least one magnetic resonance sequence. Depending on the result of the prediction, it can transpire, for example, that the measuring protocol has to be modified in respect of the breaks included in it. This would produce a new predicted run time of the measuring protocol, and this requires a new implementation of the prediction. A plurality of iterations is conceivable, wherein here, for example, a convergence criterion, for example a maximum permissible difference between repeated predictions, can be applied until the iterations occur.

It should also be noted at this point that, in addition to use for the determination of setting parameter sets, the temperature model described here can also be used in other ways, for example to determine on the basis of a specific starting temperature status of a magnetic resonance facility with the aid of the temperature model whether a measuring protocol can be run with certain protocol parameters or even to determine protocol parameters for a measuring protocol. If it is not possible to guarantee that a measuring protocol can be run, for example, with such an application a necessary waiting time or a necessary adjustment of the protocol parameters can be determined with the temperature model. The alternatives can be displayed to the user, so he can make a selection. A preferred alternative can also be configured, so no additional user interaction is necessary.

The disclosure also relates to a method for operating a magnetic resonance facility for acquiring magnetic resonance data with a measuring protocol described by protocol parameters. In an exemplary embodiment, the method includes the following steps:

providing setting parameter sets by an inventive method for providing, determining protocol parameters for the measuring protocol according to the specification of a setting parameter set provided for the measuring protocol, acquiring the magnetic resonance data using the determined protocol parameters.

All statements relating to the inventive method for providing may be applied analogously to the inventive operating method.

In the inventive operating method, it can particularly advantageously be provided that the setting parameter set is selected as a function of the affiliation of the temperature status at the beginning of the measuring protocol with a temperature status category and/or the affiliation of the magnetic resonance facility with a usage category.

Therefore, it can be provided that a current, actual starting temperature status is determined before the start of the measurement with the measuring protocol, wherein a corresponding setting parameter set is selected as a function of the affiliation of this starting temperature status with a temperature status category, namely as the setting parameter set associated with the corresponding temperature status category. The variables that describe the current temperature status, for example the current temperature of the at least one component, should be currently determined or estimated. The advantage of current determination, for example by way of a measurement, is that measurements are optimized for every single instance, in other words each individual magnetic resonance facility. The advantage of an estimate is that measuring procedures run in an identical manner for all magnetic resonance facilities of one type or model. The temperature model itself can in particular also be used for predicting a starting temperature.

It is also possible to select the setting parameter set on the basis of a usage category of the magnetic resonance facility, wherein, particularly preferably, an embodiment is selected in such a way that both criteria are used, in particular temperature status categories were defined specific to the usage category for the usage category, therefore, which, in the case of magnetic resonance facility of the corresponding usage category, are then compared with the starting temperature status of the magnetic resonance facility to select a corresponding, provided setting parameter set.

In an exemplary embodiment, the operating method provides that the actual, current temperature status is determined before the start of the measurement with the measuring protocol (starting temperature status), wherein when the current temperature status is not part of the temperature status category of the setting parameter set used, the determined protocol parameters are adjusted by using a setting parameter set associated with the temperature category, which belongs to the current temperature status, and/or by calculation by using the temperature model in such a way that overheating of the at least one component is prevented. This embodiment is expedient in particular when a certain period of time still elapses between planning the running of the measuring protocol and the actual start of the measuring protocol, for example the patient still has to be fully prepared and/or further measuring protocols have to be run before the measuring protocol that is relevant here. If, when the measuring protocol is actually intended to start, a starting temperature status is found which lies outside of the temperature status category whose setting parameter set would be used as a specification for the protocol parameters, then, within the scope of the present disclosure, it is still possible to react, for example by using the setting parameter set of the temperature status category, to which the starting temperature status belongs, for adjustment or even using the temperature model in this case to employ calculations which provide adjusted protocol parameters in such a way that overheating of the at least one component is nevertheless prevented.

As already indicated, the temperature model can also still be used in the magnetic resonance facility and during its actual operation, for example by using, in the case of a user-defined measuring protocol for which no setting parameter set has been provided, the temperature model for determining protocol parameters that prevent overheating of the at least one component.

The disclosure also relates to a provision facility for carrying out an inventive method for providing, having a category defining facility for defining the temperature status categories, a modeling facility of setting parameter sets and an interface for providing the setting parameter sets. The provision facility can specifically comprise at least one processor and at least one storage means. All statements in respect of the inventive method for providing may be applied analogously to the inventive provision facility with which said advantages can likewise be obtained, therefore.

An inventive magnetic resonance facility has a control facility designed for carrying out an inventive operating method, which can likewise have, in particular, at least one processor and at least one storage means. The control facility can have an interface for communication with an inventive provision facility, in particular with the interface thereof to provide the setting parameter sets. The magnetic resonance facility can also have different functional units for carrying out steps of the inventive methods.

An inventive computer program can, for example, be loaded directly into a storage device of a provision facility or a control facility of a magnetic resonance facility, and has program means to carry out the steps of a method described herein when the computer program is run in the provision facility or the control facility of the magnetic resonance facility, wherein the computer program for a provision facility effects the implementation of an inventive method for providing, and the computer program for the control facility of the magnetic resonance facility effects the implementation of an inventive operating method. Inventive computer programs can be stored on electronically readable data carriers, with an electronically readable data carrier of this kind, therefore, comprising electronically readable control information stored thereon, which comprises at least one inventive computer program and is configured in such a way that it carries out an inventive providing method or operating method when the data carrier is used in a provision facility or a control facility respectively of a magnetic resonance facility. The data carrier can be a non-transient data carrier, for example a CT-ROM.

Figure 1:
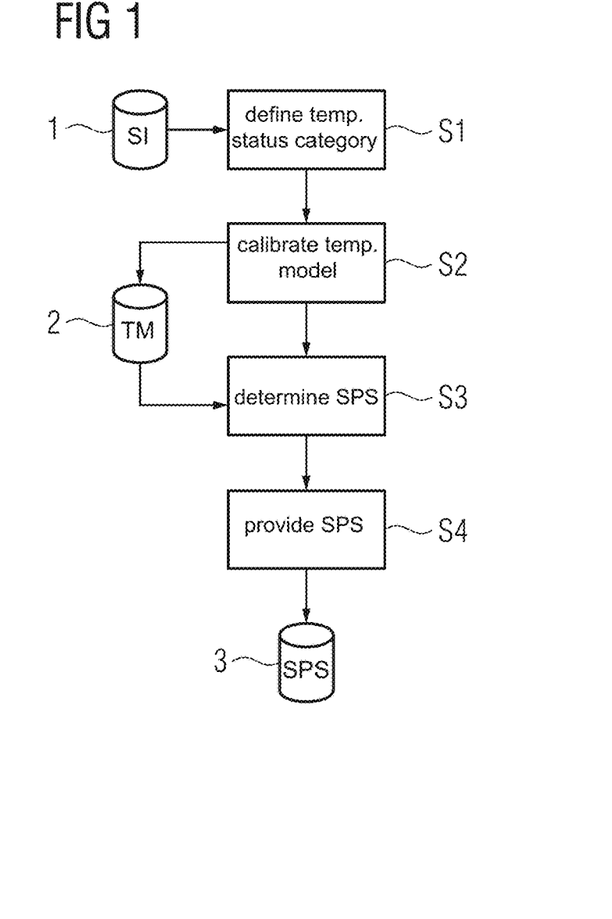
FIG. 1 is a flowchart of a method according to an exemplary embodiment.

FIG. 1 shows a flowchart of an exemplary embodiment of an inventive method for providing, with which setting parameter sets for different measuring protocols of a magnetic resonance facility, which belongs to a particular type/model or a particular category of magnetic resonance facilities, can be determined and provided. Measuring protocols are described in this case by protocol parameters, which, since measuring protocols conventionally comprise at least one magnetic resonance sequence, also comprise sequence parameters of this at least one magnetic resonance sequence. Setting parameters contain specifications for the protocol parameters, for example specified values for particular protocol parameters and/or specified, permissible value ranges, therefore, within which the value of the protocol parameter can be selected, for example by a user. In the present case, the specifications set down in the setting parameter sets are at least such that overheating of at least one particular component of the magnetic resonance facility, which is heated in measuring operation with the measuring protocol, is prevented. The at least one component can comprise, for example, a gradient coil arrangement, a gradient amplifier, cable or the like. Here, heating of the at least one component occurs, in particular, due to gradient pulses of the at least one magnetic resonance sequence, therefore. Also relevant in respect of possible overheating of the at least one component, in particular in respect of preventing the component from exceeding a limit temperature, therefore, are protocol parameters determining the course over time of the measuring protocol, for example repetition times, echo times and the like, since these ultimately determine to what extent cooling periods exist. Accordingly, corresponding setting parameters of the setting parameter set can be associated with such protocol parameters. In general, when using inventive methods, setting parameter sets are provided whose specifications are not just geared toward preventing overheating of the at least one component, but also comprise an optimization with regard to the total duration of the measuring protocol and/or the image quality.

The temperature status, in particular in respect of the temperature of the at least one component, at which the magnetic resonance facility is at the beginning of running of the measuring protocol has a fundamental effect on the question as to whether overheating occurs when processing a measuring protocol with a magnetic resonance facility. Therefore, in a step S1 of the exemplary embodiment illustrated in FIG. 1, firstly specification information 1 is used to define temperature status categories for which setting parameter sets are to be determined. Temperature status categories are in this case, in particular, ranges of temperature statuses, in the case of consideration of an individual component and its temperature, for example temperature ranges of the component. Generally speaking, temperature status categories can divide, for example, the range of temperature statuses of the magnetic resonance facility from "cold" to "hot" into corresponding sub-ranges. The specification information 1, the use of which is, generally speaking, optional but is preferred, using data acquired during operation of structurally identical magnetic resonance facilities, describes which temperature statuses already occurred at the beginning of a measurement with the measuring protocol, preferably broken down according to usage categories of the magnetic resonance facility. On this basis, temperature status categories can be defined, for example in particular specific to the usage category, such that a temperature status category comprises a particular percentage of all temperature statuses that have occurred, excluding the "hottest" temperature statuses. A finer subdivision into temperature status categories is also possible, for example the 20% of temperature statuses with the lowest temperatures, the 50% of temperature statuses with the lowest temperatures without the lowest 20%, etc. In each case the specification information 1 is expedient to the extent that temperature status categories can be defined, which are actually relevant to the magnetic resonance facility, for example a type of default temperature status category can be defined for which, for example with 95% of all observed temperature statuses at the beginning of the measuring protocol, no overheating is to be feared.

In addition or as an alternative, temperature status categories can also be defined in some other way. Reference is made in this respect by way of example to the examples already illustrated above relating to the "ideal initial conditions", "typical initial conditions" and "worst case initial conditions".

If the specification information 1 is broken down according to usage categories, then temperature status categories can also be determined in different ways for different usage categories. For example, for only sporadically used magnetic resonance facilities, the 95% of the limits defining observed starting temperature statuses at lower temperatures are to be sought than with well utilized magnetic resonance facilities or even research equipment.

In a step S2 a temperature model 2, which is to be used for determining the setting parameter sets, is calibrated. This means that model parameters of the temperature model 2, cf. for example formulae (4) and (5), there the parameters τ and α, can be determined by calibration measurements, wherein in the present case it is assumed that the cooling temperature Tcool can be regarded as being specific to the design and known, therefore. The calibration measurement can purposefully take place on the magnetic resonance facility, in other words the corresponding individual copy for which the setting parameter sets are to be determined in order to take account of the individual copy spread, but also over a plurality of structurally identical magnetic resonance facilities, wherein here, extreme case exceptions are preferably made. In the present case, as has already been described in relation to the specifically used temperature model 2 according to formulae (3) to (5), in each case time constants τ are considered, which are much longer than the time structure during the magnetic resonance sequence, in particular are a minute or more, in order to justify the use of determined gradient strengths, cf. formula (1) or (2).

In step S3 the calibrated temperature model 2 is then used to determine setting parameter sets 3, which can then be provided in a step S4. The setting parameter sets 3 are determined such that for each temperature status which is included in a temperature status category, overheating is prevented, so they are determined specific to the temperature status category, therefore. A particular number of repetitions is also assumed for which the measuring protocol can be repeated, wherein in the exemplary embodiment described here the number of repetitions is set at a maximum of one since this matches the case most applicable to many measuring protocols. It should be pointed out that it is basically also conceivable to determine setting parameter sets 3 for different numbers of repetitions. It is of course equally possible to determine setting parameter sets 3 for different measuring protocols and/or also to determine a setting parameter set 3 for specifications usable in each case, for example as a fallback solution. A setting parameter set 3 of this kind would then correspond to the RORE case.

When determining the setting parameter sets 3 for the different temperature status categories, the most extreme temperature statuses included in a respective temperature status category, the temperature statuses that describe the hottest temperatures, therefore, can be assumed. The determination can take place with additional optimization criteria, as described, in particular, minimization of the total duration of the measuring protocol and/or maximization of the image quality. An iterative process can take place in order to be able to find optimum combinations of protocol parameters and setting parameters, therefore.

Figure 2:
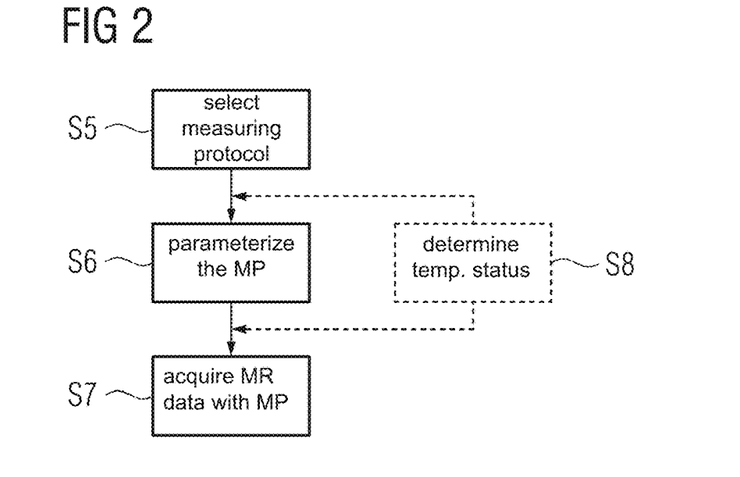
FIG. 2 is a flowchart of an operating method according to an exemplary embodiment.

FIG. 2 illustrates an exemplary embodiment of an inventive method for operating a magnetic resonance facility, which was provided with setting parameter sets 3. In a step S5, a measuring protocol is selected with the aid of which, for example, magnetic resonance data of a patient is to be acquired. While it is conceivable to define a specified default temperature status category and to select the corresponding setting parameter set 3 to parameterize the measuring protocol in step S6 according to these specifications, it is also conceivable in an optional step S8 to find the current temperature status of the magnetic resonance facility in order to then select the setting parameter set 3, which is associated with the temperature status category into which the current temperature status of the magnetic resonance facility falls.

In each case the selected setting parameter set 3 is used in step S6 to set corresponding protocol parameters, for example at least partially automatically and/or at least partially manually, in particular in specified value ranges. In a step S7, the magnetic resonance data can then be acquired with the measuring protocol, which are used protocol parameters selected by taking into account the specification of the setting parameter set 3. Here too it is conceivable to carry out optional step S8, determining the current temperature status of the magnetic resonance facility, in order to check whether the current temperature status of the magnetic resonance facility is still in the correct temperature status category. If this is not the case, for example an appropriate setting parameter set 3 from a different temperature status category can be used to make adjustments and/or a fallback solution can be used, for example a RORE protocol.

It should also be noted that an instance of the temperature model 2 can be provided on the magnetic resonance facility. The temperature model 2 can be used, for example, on the magnetic resonance facility, which has already been operating to determine protocol parameters that prevent overheating of the at least one component for user-defined measuring protocols for which no setting parameter sets 3 are available, or else to be able to make adjustments in the case of temperature statuses not covered by temperature status categories at the beginning of a measuring protocol.

Figure 3:
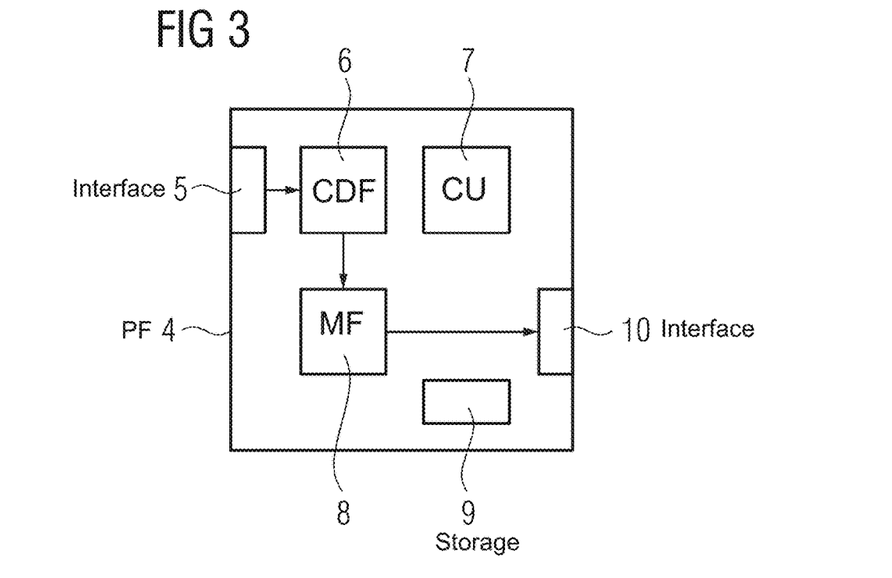
FIG. 3 illustrates a provision facility according to an exemplary embodiment.

FIG. 3 shows a schematic diagram of the functional structure of an inventive provision facility 4. This optionally has an interface 5 for receiving the specification information. According to step S1, the temperature status categories can be defined in a category defining facility 6. A calibrating unit 7 can control the calibration of step S2 or evaluate the results of the calibration measurement. Finally, a modeling facility 8 is provided for application of the temperature model 2, which can be stored in a storage means 9 in order to determine the setting parameter sets 3 according to step S3. These can then be made available via an appropriate interface 10 in order to provide the setting parameter sets 3. In an exemplary embodiment, the provision facility 4 (or one or more components therein) includes processor circuitry that is configured to perform one or more functions and/or operations of the provision facility 4 (or corresponding components).

Figure 4:
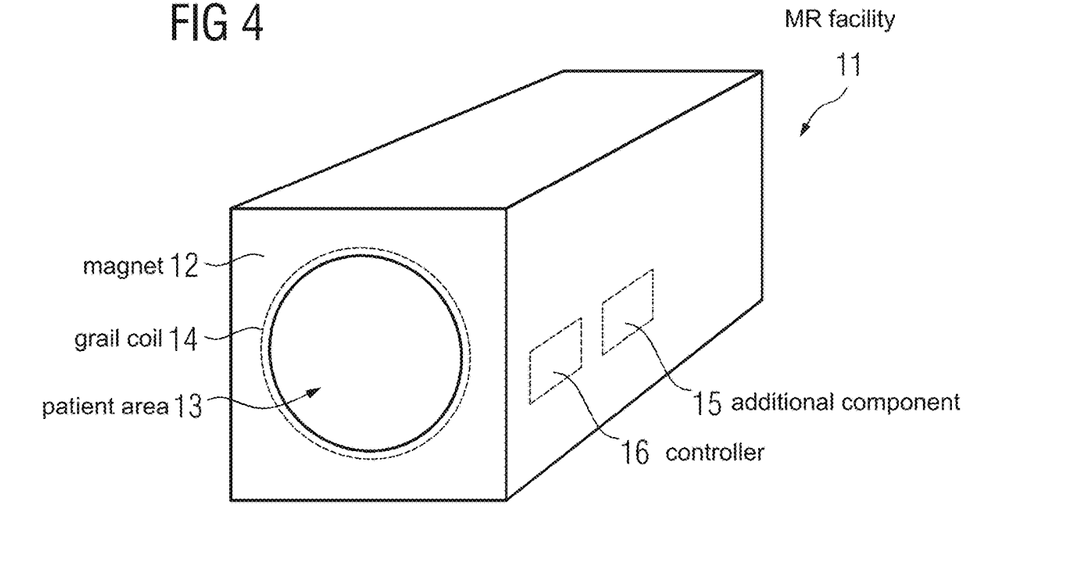
FIG. 4 illustrates a magnetic resonance facility according to an exemplary embodiment.

FIG. 4 shows a schematic diagram of an inventive magnetic resonance facility 11 according to an exemplary embodiment. The facility 11 includes, as is basically known, a main magnetic unit 12, in which the basic field magnet for generating the basic magnetic field is received. The main magnetic unit 12 defines a patient receiver 13 into which a patient can be moved via a patient couch (not shown here). Surrounding the patient couch 13, in addition to a radio frequency coil arrangement (not shown here), a gradient coil arrangement 14 is provided, which can be a component, the overheating of which is to be prevented. At least one further or different component 15 is also indicated in FIG. 4. Operation of the magnetic resonance facility 11 is controlled by means of a control facility (controller) 16. In an exemplary embodiment, the controller 16 includes processor circuitry that is configured to perform one or more functions and/or operations of the controller 16. In an exemplary embodiment, the facility 11 (or one or more other components therein) includes processor circuitry that is configured to perform one or more functions and/or operations of the facility 11 (or corresponding components).

Figure 5:
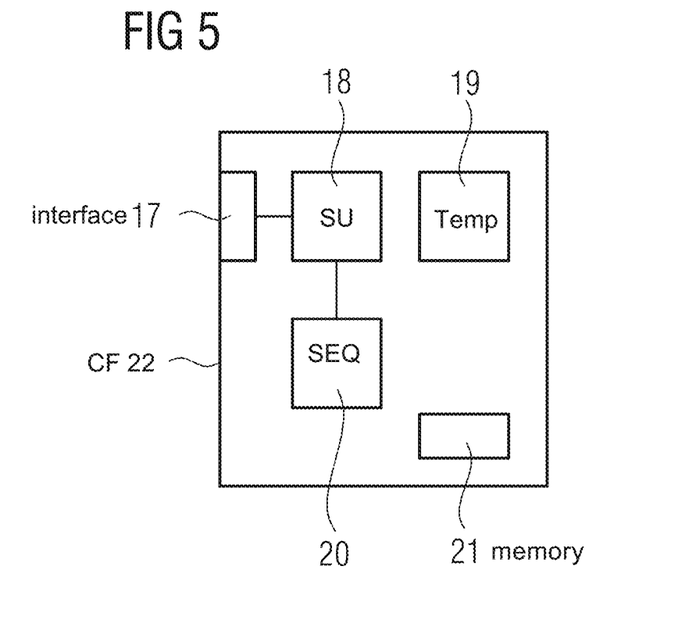
FIG. 5 illustrates a functional structure of a control facility of the magnetic resonance facility of FIG. 4.

FIG. 5 shows the functional structure of the control facility 22 in more detail. In the present case, the control facility 22 comprises an interface 17 for receiving setting parameter sets 3 from the provision facility 4. In a setting unit 18, setting parameter sets 3 can be used in order to parameterize measuring protocols according to the specifications described for them, to determine their protocol parameters correspondingly, therefore. A current temperature status of the magnetic resonance facility 11 can be found, for example by a temperature unit 19 (step S8). Also shown is a sequence unit 20 conventional for magnetic resonance facilities 11, via which magnetic resonance data can be acquired by means of appropriate measuring protocols. In an exemplary embodiment, the control facility 22 (or one or more components therein) includes processor circuitry that is configured to perform one or more functions and/or operations of the control facility 22 (or corresponding components).

The control facility 22 can also comprise a storage means (memory) 21 in which the temperature model 2, appropriately calibrated for the magnetic resonance facility 11, can also be stored.

Although the disclosure has been illustrated and described in detail by the preferred exemplary embodiment it is not limited by the disclosed examples and a person skilled in the art can derive other variations herefrom without departing from the scope of the disclosure.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for providing setting parameter sets for a measuring protocol described by protocol parameters for acquiring magnetic resonance data with a magnetic resonance facility, comprising:
  determining at least one model parameter of a temperature model in a calibration measurement with the magnetic resonance facility, wherein a magnetic resonance sequence is used for the calibration measurement that incorporates a known mean gradient power;

determining at least two temperature status categories of the magnetic resonance facility based on corresponding usage categories of the magnetic resonance facility, each of the at least two temperature status categories being different and including at least one different temperature status of at least one component of the magnetic resonance facility;

determining a different setting parameter set for each of the at least two temperature status categories of the magnetic resonance facility using the temperature model describing a development of the different temperature statuses of the at least one component of the magnetic resonance facility, the at least one component being heated when the measuring protocol is run, wherein the setting parameter set includes specified values for at least some of the protocol parameters and/or specified value ranges for at least some of the protocol parameters;

determining a current temperature status category from the at least two temperature status categories based on: a comparison of a current temperature status of at least one component and the different temperature statuses of the at least two temperature status categories, and/or a usage category of the magnetic resonance facility; and selecting a corresponding one of the different setting parameter sets, based on the determined current temperature status category, to determine corresponding protocol parameters for the measuring protocol to prevent, during running of the measuring protocol and at a beginning of a measurement with the measuring protocol, overheating of the at least one component due to the measurement with the measuring protocol being repeated a maximum number of times for a specified number of repetitions, the overheating being defined by a limit temperature being exceeded, wherein the different setting parameter sets are determined such that the overheating is prevented for each starting temperature status included in a temperature status category of at least two temperature status categories.

2. The method as claimed in claim 1, wherein the temperature status categories are defined by evaluating starting temperature statuses determined when using a structurally identical magnetic resonance facility for specification information that describes the measuring protocol.

3. The method as claimed in claim 2, wherein the specification information is in a form broken down according to at least one usage category, wherein the evaluation and/or definition of the temperature status categories takes place as a function of the at least one usage category.

4. The method as claimed in claim 2, wherein at least some of the temperature status categories are determined in such a way that a specified proportion of the starting temperature statuses of the specification information is included, wherein the specification information is considered specific to at least one usage category and which rules out starting temperature statuses with the highest temperatures, is included.

5. The method as claimed in claim 1, wherein at least some of the temperature status categories are defined by threshold values for the temperature of the at least one component, the threshold values being selected at least in part as a function of a cooling temperature to which the at least one component is cooled by a cooling facility associated therewith, and/or the limit temperature.

6. The method as claimed in claim 1, wherein at least some of the temperature status categories are defined as a function of a mode of the magnetic resonance facility in a period ending at the beginning of the measuring protocol.

7. The method as claimed in claim 1, wherein the temperature model is a linear temperature model in which, in a differential equation, a linear correlation is assumed between the temperature and its derivation over time over a time constant and an energy balance that considers a power input.

8. The method as claimed in claim 7, wherein the time constant is greater than one minute, and the power input is assumed to be proportional to a mean gradient power.

9. The method as claimed in claim 8, wherein the mean gradient power is a gradient strength mean squared.

10. A non-transitory computer-readable storage medium with an executable program stored thereon, that when executed, instructs a processor to perform the method of claim 1.

11. A method for operating a magnetic resonance facility to acquire magnetic resonance data with a measuring protocol described by protocol parameters, the method comprising:

providing different setting parameter sets, wherein:

at least one model parameter of a temperature model is determined in a calibration measurement with the magnetic resonance facility, wherein a magnetic resonance sequence is used for the calibration measurement that incorporates a known mean gradient power, temperature status categories of the magnetic resonance facility are determined based on corresponding usage categories of the magnetic resonance facility, each of the temperature status categories being different and including at least one different temperature status of at least one component of the magnetic resonance facility, the different setting parameter sets are determined for each of the temperature status categories of the magnetic resonance facility using the temperature model describing a development of the different temperature statuses of the at least one component of the magnetic resonance facility, the at least one component being heated when the measuring protocol is run, the different setting parameter sets include specified values for at least some of the protocol parameters and/or specified value ranges for at least some of the protocol parameters, a current temperature status category is determined from the temperature status categories based on: a comparison of a current temperature status of at least one component and the different temperature statuses of the temperature status categories, and/or a usage category of the magnetic resonance facility, a corresponding one of the different setting parameter sets is selected, based on the determined current temperature status category, to determine corresponding protocol parameters for the measuring protocol to prevent, during running of the measuring protocol and at a beginning of a measurement with the measuring protocol, overheating of the at least one component due to the measurement with the measuring protocol being repeated a maximum number of times for a specified number of repetitions, the overheating being defined by a limit temperature being exceeded, the different setting parameter sets are determined such that the overheating is prevented for each starting temperature status included in a temperature status category of at least two temperature status categories;

determining protocol parameters for the measuring protocol based on the selected corresponding one of the different setting parameter sets; and acquiring the magnetic resonance data using the determined protocol parameters.

12. The method as claimed in claim 11, wherein the corresponding one of the different setting parameter sets is selected based on: an affiliation of a current temperature status of at least one component of the magnetic resonance facility at a beginning of the measuring protocol with the temperature status category, and/or an affiliation of the magnetic resonance facility with a usage category.

13. The method as claimed in claim 11, further comprising:

determining an actual, current temperature status before a start of the measurement with the measuring protocol, wherein, when the determined actual current temperature status is not part of the temperature status category of the selected corresponding one of the different setting parameter sets, the determined protocol parameters are adjusted by using a setting parameter set, of the different setting parameter sets, associated with a temperature status category belong to the determined actual current temperature status, and/or by way of a calculation using the temperature model to facilitate prevention of overheating of the at least one component.

14. A non-transitory computer-readable storage medium with an executable program stored thereon, that when executed, instructs a processor to perform the method of claim 11.

15. A provision facility, comprising:
a category defining facility configured to define the temperature status categories,
a modeling facility configured to perform the method of claim 1 to determine setting parameter sets, and
an interface configured to provide the determined setting parameter sets.

16. A magnetic resonance facility, comprising:
a scanner; and
a controller configured to perform the method as claimed in claim 11.

* * * * *